(12) United States Patent
Takahashi et al.

(10) Patent No.: US 8,947,155 B2
(45) Date of Patent: Feb. 3, 2015

(54) SOLID-STATE RELAY

(71) Applicant: Semiconductor Energy Laboratory Co., Ltd., Atsugi-shi, Kanagawa-ken (JP)

(72) Inventors: Kei Takahashi, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/826,891

(22) Filed: Mar. 14, 2013

(65) Prior Publication Data

US 2013/0265098 A1    Oct. 10, 2013

(30) Foreign Application Priority Data

Apr. 6, 2012    (JP) .................. 2012-087025

(51) Int. Cl.
H03K 17/60 (2006.01)
H03K 17/687 (2006.01)
H03K 17/785 (2006.01)

(52) U.S. Cl.
CPC ............ *H03K 17/687* (2013.01); *H03K 17/785* (2013.01)
USPC ............ 327/434; 327/433; 327/432; 345/204

(58) Field of Classification Search
USPC ................................. 327/365–508
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,747,836 A * | 5/1998 | Mariyama ..................... 257/119 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Brandon S Cole
(74) *Attorney, Agent, or Firm* — Fish & Richardson P.C.

(57) ABSTRACT

A solid-state relay is provided, which includes a first transistor, a second transistor, a first transmission circuit, and a second transmission circuit. A gate of the first transistor is connected to one of a source and a drain of the second transistor, one of a source and a drain of the first transistor is connected to a first terminal, and the other of the source and the drain of the first transistor is connected to a second terminal. The first transmission circuit supplies a first signal to the gate of the first transistor. The second transmission circuit supplies a second signal to a gate of the second transistor. The first terminal is connected to the second terminal when the first transistor is turned on by the first signal.

18 Claims, 12 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0155874 A1* | 8/2004 | Moon ............................ 345/204 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1* | 6/2006 | Den et al. ......................... 257/79 |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1* | 9/2006 | Kimura ............................ 345/76 |
| 2006/0228974 A1 | 10/2006 | Thelss et al. |
| 2006/0231882 A1 | 10/2006 | Kim et al. |
| 2006/0238135 A1* | 10/2006 | Kimura ....................... 315/169.3 |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1* | 7/2007 | Lai et al. ......................... 257/59 |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1* | 10/2008 | Park et al. ......................... 257/43 |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| JP | 60-198861 A | 10/1985 |
| JP | 62-250718 A | 10/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

(56) References Cited

OTHER PUBLICATIONS

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5') Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

(56) References Cited

OTHER PUBLICATIONS

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZnO_4$—ZnO system at 1350° C.," Journal of Solid State Chemisry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

SOLID-STATE RELAY

BACKGROUND OF THE INVENTION

1. Field of the Invention

The present invention relates to solid-state relays transmitting signals wirelessly and semiconductor device including the solid-state relays.

2. Description of the Related Art

In a solid-state relay, signals are transmitted without contact between a signal input-side circuit and an output-side circuit controlling power output with the use of a photocoupler or the like including a light-emitting element and a light-receiving element. Specifically, a solid-state relay having a photocoupler includes at least a light-emitting element, a light-receiving element generating electromotive force by reception of light from the light-emitting element, and a semiconductor element whose conduction or non-conduction is selected by the electromotive force. Power is output when the semiconductor element is conducting, and power output is stopped when the semiconductor element is not conducting.

A latching solid-state relay needs power when the conduction or non-conduction of the semiconductor element is changed, whereas the latching solid-state relay does not need power when the conduction or non-conduction of the semiconductor element is unchanged. Thus, power consumption can be reduced. Patent Document 1 discloses a contactless relay that employs photocoupler isolation and has a latching function.

REFERENCE

[Patent Document 1] Japanese Published Patent Application No. 62-250718

SUMMARY OF THE INVENTION

The contactless relay disclosed in Patent Document 1 achieves a latching function by using a thyristor as the semiconductor element. However, the thyristor has higher off-state current flowing in a non-conduction state than a silicon transistor; thus, the contactless relay tends to be applied only to a high-power device. Further, the speed of switching conduction and non-conduction of the thyristor is one or more orders of magnitude lower than that of the silicon transistor; thus, it is difficult to achieve high-speed switching.

With the technical background, an object of the present invention is to provide a solid-state relay that can perform switching at high speed. Alternatively, an object of the present invention is to provide a latching solid-state relay that can perform switching at high speed.

An object of the present invention is to provide a high-performance semiconductor device including a solid-state relay that can perform switching at high speed. Alternatively, an object of the present invention is to provide a high-performance low-power semiconductor device including a latching solid-state relay that can perform switching at high speed.

A solid-state relay according to a first structure of the present invention includes a transistor as a semiconductor element controlling power output. When a potential difference is applied between a gate electrode and a source terminal of the transistor controlling power output, in response to a signal supplied wirelessly, the transistor is turned on, and power is supplied to a load placed next to the solid-state relay. Since the solid-state relay according to the first structure of the present invention includes the transistor as the semiconductor element controlling power output, switching of the solid-state relay can be performed at high speed.

The solid-state relay according to the first structure of the present invention further includes at least one of a first switch and a second switch. The first switch has a function of applying the potential of the signal supplied wirelessly to the gate electrode of the transistor controlling power output and holding the potential applied to the gate electrode. The second switch has a function of controlling electrical connection and electrical disconnection between the gate electrode and the source terminal of the transistor controlling power output.

A transistor with extremely low off-state current is used in the first switch. When the solid-state relay according to the first structure of the present invention includes the first switch with the above structure, the potential difference applied between the gate electrode and the source terminal of the transistor controlling power output can be held even after input of signals from an input-side circuit is stopped. Thus, even when signals are not continuously input from the input-side circuit wirelessly, the transistor controlling power output can be kept on. Consequently, power is output from the solid-state relay continuously.

When the solid-state relay according to the first structure of the present invention includes the second switch, the gate electrode and the source terminal of the transistor controlling power output that are electrically disconnected can be electrically connected by switching of the transistor included in the second switch. Thus, switching of the solid-state relay from a power output state to a power output stop state, that is, switching of the solid-state relay from an on state to an off state can be performed at higher speed.

In the case where the solid-state relay according to the first structure of the present invention includes the first switch and the second switch and not only the first switch but also the second switch includes a transistor with extremely low off-state current, even when power is not continuously supplied from the input circuit wirelessly, power can be output from the solid-state relay continuously and switching of the solid-state relay from an on state to an off state can be performed at higher speed.

A solid-state relay according to a second structure of the present invention includes a transistor as a semiconductor element controlling power output and transmits a signal from an input-side circuit to an output-side circuit with the use of a photocoupler. When a potential difference is applied between a gate electrode and a source terminal of the transistor in response to a signal received in a light-receiving element, the transistor is turned on, and power is supplied to a load placed next to the solid-state relay.

The solid-state relay according to the second structure of the present invention further includes a first switch and a second switch in addition to the transistor controlling power output. The first switch has a function of applying a potential difference between the gate electrode and the source terminal of the transistor controlling power output in response to the signal received in the light-receiving element and holding the potential difference. The second switch has a function of controlling electrical connection and electrical disconnection between the gate electrode and the source terminal of the transistor. A transistor with extremely low off-state current is used in each of these switches.

Since the solid-state relay according to the second structure of the present invention includes the two switches each having a transistor with extremely low off-state current, the potential difference applied between the gate electrode and the source terminal of the transistor controlling power output can be held even after reception of signals in the light-receiving element is stopped, that is, even after generation of electromotive force in the light-receiving element is stopped. Thus, the transistor controlling power output can be kept on even when a light-emitting element does not emit light continuously. Consequently, power can be output from the solid-state relay continuously.

The solid-state relay according to the second structure of the present invention includes a light-receiving element for applying a potential difference between the gate electrode and the source terminal of the transistor controlling power output and a light-receiving element for stopping output of power from the solid-state relay. Specifically, the solid-state relay according to the second structure of the present invention further includes a light-receiving element for applying a potential difference between a gate electrode and a source terminal of the transistor with extremely low off-state current in the second switch controlling electrical connection and electrical disconnection between the gate electrode and the source terminal of the transistor controlling power output.

In the second switch, the transistor with extremely low off-state current is turned on by application of a potential difference between the gate electrode and the source terminal by electromotive force generated in the light-receiving element. Thus, the gate electrode and the source terminal of the transistor controlling power output are electrically connected, so that the transistor controlling power output is turned off. Consequently, output of power from the solid-state relay is stopped.

In the solid-state relay according to the second structure of the present invention, the potential difference applied between the gate electrode and the source terminal of the transistor controlling power output is held even after generation of electromotive force in the light-receiving element is stopped. However, in the solid-state relay according to the second structure of the present invention, by using the light-receiving element for stopping output of power from the solid-state relay, the gate electrode and the source terminal of the transistor controlling power output that are electrically disconnected can be electrically connected instantaneously. Thus, regardless of whether a light-emitting element for applying a potential difference between the gate electrode and the source terminal of the transistor controlling power output emits light continuously, output of power from the solid-state relay can be stopped instantaneously.

According to one embodiment of the present invention, it is possible to provide a solid-state relay that can perform switching at high speed. According to one embodiment of the present invention, it is possible to provide a latching solid-state relay that can perform switching at high speed.

According to one embodiment of the present invention, it is possible to provide a high-performance semiconductor device including a solid-state relay. According to one embodiment of the present invention, it is possible to provide a high-performance low-power semiconductor device including a solid-state relay.

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

(Embodiment 1)

Figure 1A:
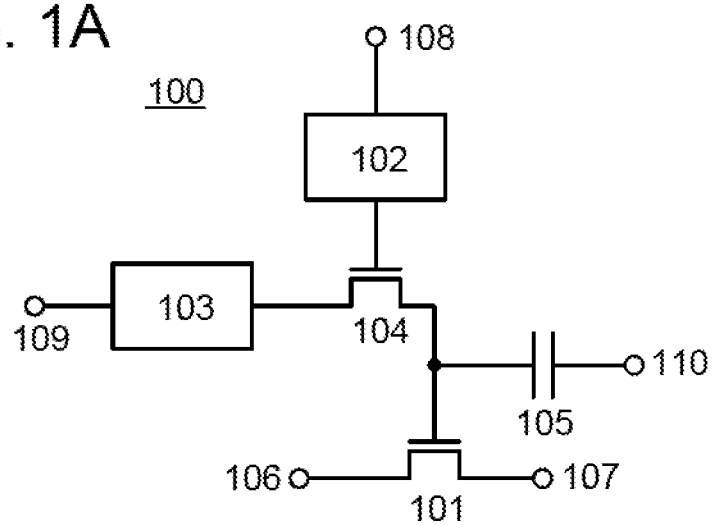
FIGS. 1A and 1B each illustrate a structure of a solid-state relay according to a first structure of the present invention.

FIG. 1A illustrates a structure example of a solid-state relay according to a first structure of the present invention. A solid-state relay 100 in FIG. 1A includes a transistor 101, a transmission circuit 102, a transmission circuit 103, a transistor 104, and a capacitor 105.

The transistor 101 has a function of controlling output of power from the solid-state relay 100 by electrically connecting or disconnecting terminals 106 and 107. Specifically, when the transistor 101 is on, power is output from the solid-state relay 100 in response to voltage applied between the terminals 106 and 107. When the transistor 101 is off, output of power from the solid-state relay 100 is stopped regardless of the voltage applied between the terminals 106 and 107.

The transmission circuits 102 and 103 each have a function of transmitting a signal input to the solid-state relay 100. At least the transmission circuit 103 has a function of wirelessly transmitting a signal input in the transmission circuit 103, and for example, can be a photocoupler or the like.

A signal supplied to a terminal 108 is supplied to a gate electrode of the transistor 104 through the transmission circuit 102, and a signal supplied to a terminal 109 is supplied to a source terminal or a drain terminal of the transistor 104 through the transmission circuit 103. Then, voltage between the gate electrode and the source terminal (i.e., so-called gate voltage) of the transistor 104 is determined based on the potentials of these signals, so that an on state or off state of the transistor 104 is selected.

Note that a source terminal of a transistor means a source region that is part of a semiconductor film functioning as an active layer or a source electrode that is connected to the semiconductor film functioning as an active layer. Similarly, a drain terminal of a transistor means a drain region that is part of a semiconductor film functioning as an active layer or a drain electrode that is connected to the semiconductor film functioning as an active layer.

The terms "source terminal" and "drain terminal" of a transistor interchange with each other depending on the type of the channel of the transistor or levels of potentials applied to the source terminal and the drain terminal. In general, in an n-channel transistor, a terminal to which a low potential is applied is called a source terminal, and a terminal to which a high potential is applied is called a drain terminal. Further, in a p-channel transistor, a terminal to which a low potential is applied is called a drain terminal, and a terminal to which a high potential is applied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

The transistor 104 corresponds to a first switch, and has a function of applying the potential of a signal supplied wirelessly to the gate electrode of the transistor 101 and holding the potential applied to the gate electrode of the transistor 101. Specifically, when the transistor 104 is on, the potential of a signal supplied to the terminal 109 is applied to the gate electrode of the transistor 101 through the transmission circuit 103 and the transistor 104. When the transistor 104 is off, the potential applied to the gate electrode of the transistor 101 is held.

Note that the capacitor 105 has a function of holding the potential applied to the gate electrode of the transistor 101 when the transistor 104 is off. Specifically, the capacitor 105 is provided between the gate electrode of the transistor 101 and a terminal 110. A predetermined potential may be applied to the terminal 110. Alternatively, the terminal 110 may be connected to the source terminal of the transistor 101. Note that in the case where gate capacitance formed between the gate electrode and a semiconductor film of the transistor 101 or parasitic capacitance added to the gate electrode is high enough to hold a potential, the solid-state relay 100 according to one embodiment of the present invention does not necessarily include the capacitor 105.

Note that in this specification, the term "connection" means electrical connection with contact and corresponds to a state where current, voltage, or a potential can be supplied or transmitted with contact. Accordingly, a connection state does not always mean a direct connection state but includes an indirect connection state through an element such as a wiring, a resistor, a diode, or a transistor so that current, voltage, or a potential can be supplied or transmitted.

In addition, in the solid-state relay 100 in FIG. 1A according to the first structure of the present invention, the off-state current of the transistor 104 is extremely low. A transistor including a channel formation region containing a semiconductor that has a wide band gap and is highly purified by reduction of impurities such as moisture or hydrogen that serve as electron donors (donors) and reduction of oxygen vacancies has extremely low off-state current, and thus is preferably used as the transistor 104.

Note that unless otherwise specified, in this specification, off-state current of an n-channel transistor is current that flows between a source terminal and a drain terminal when the potential of the drain terminal is higher than that of the source terminal or that of a gate electrode while the potential of the gate electrode is 0 V or lower in the case of the potential of the source terminal used as a reference. In this specification, off-state current of a p-channel transistor is current that flows between a source terminal and a drain terminal when the potential of the drain terminal is lower than that of the source terminal or that of a gate electrode while the potential of the gate electrode is 0 V or higher in the case of the potential of the source terminal used as a reference.

Examples of a semiconductor material that has a wider band gap than that of a silicon semiconductor and has lower intrinsic carrier density than silicon include a compound semiconductor such as gallium nitride (GaN), in addition to an oxide semiconductor. The oxide semiconductor has an advantage of high mass productivity because a transistor with favorable electrical characteristics can be formed by sputtering or a wet process, unlike gallium nitride. Further, unlike silicon carbide or gallium nitride, the oxide semiconductor can be deposited even at room temperature; thus, a transistor with favorable electrical characteristics can be formed over a glass substrate or an integrated circuit using silicon. Furthermore, a larger substrate can be used. Thus, among the wide band gap semiconductors, the oxide semiconductor particularly has an advantage of high mass productivity. In the case where a crystalline oxide semiconductor is to be obtained in order to improve the performance of a transistor (e.g., field-effect mobility), the crystalline oxide semiconductor can be easily obtained by heat treatment at 250 to 800° C.

Note that a highly-purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including the oxide semiconductor has extremely low off-state current. Further, the band gap of the oxide semiconductor is 2 eV or more, preferably 2.5 eV or more, more preferably 3 eV or more. With the use of an oxide semiconductor film that is highly purified by a sufficient decrease in concentration of impurities such as moisture or hydrogen and reduction of oxygen vacancies, the off-state current of the transistor can be decreased.

Specifically, various experiments can prove low off-state current of a transistor including a highly-purified oxide semiconductor film in a channel formation region. For example, even when an element has a channel width of $1\times10^6$ μm and a channel length of 10 μm, off-state current can be lower than or equal to the measurement limit of a semiconductor parameter analyzer, that is, lower than or equal to $1\times10^{-13}$ A, at a voltage (drain voltage) between a source electrode and a drain electrode of 1 to 10 V. In that case, it can be seen that off-state current standardized on the channel width of the transistor is lower than or equal to 100 zA/μm. In addition, a capacitor and a transistor were connected to each other and off-state current was measured using a circuit in which electrical charge flowing to or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including the highly-purified oxide semiconductor film for a channel formation region has much lower off-state current than a crystalline silicon transistor.

Since the off-state current of the transistor 104 is extremely low, a potential difference between the gate electrode and the source terminal of the transistor 101 can be held even after input of signals from the terminal 109 is stopped. Thus, even when signals are not input from the terminal 109 continuously, the transistor 101 controlling power output is kept on. Consequently, power is output from the solid-state relay 100 continuously.

Figure 1B:
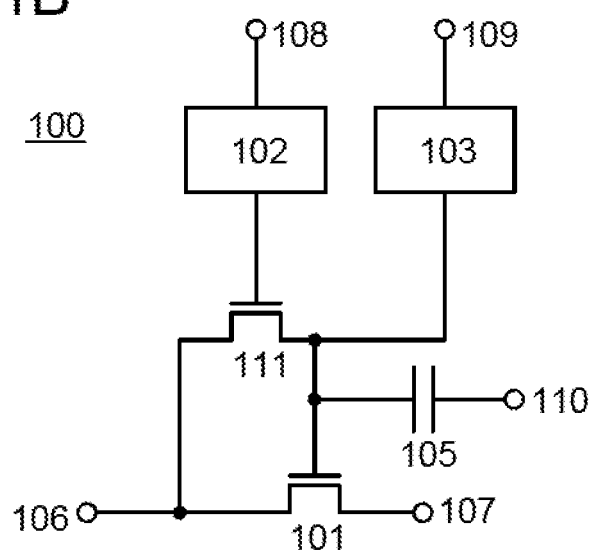

Next, FIG. 1B illustrates a structure example of the solid-state relay according to the first structure of the present invention. The solid-state relay 100 in FIG. 1B includes the transistor 101, the transmission circuit 102, the transmission circuit 103, a transistor 111, and the capacitor 105.

As in FIG. 1A, the transistor 101 has a function of controlling output of power from the solid-state relay 100 by electrically connecting or disconnecting the terminals 106 and 107.

As in FIG. 1A, the transmission circuits 102 and 103 each have a function of transmitting a signal input to the solid-state relay 100. At least the transmission circuit 103 has a function of wirelessly transmitting a signal input, and for example, can be a photocoupler or the like.

In the solid-state relay 100 in FIG. 1B, a signal supplied to the terminal 108 is supplied to a gate electrode of the transistor 111 through the transmission circuit 102, and a signal supplied to the terminal 109 is supplied to the gate electrode of the transistor 101 through the transmission circuit 103. Then, voltage between the gate electrode and a source terminal (i.e., so-called gate voltage) of the transistor 111 is determined based on the potentials of these signals and the potential of the terminal 106, so that an on state or off state of the transistor 111 is selected.

The transistor 111 corresponds to a second switch and has a function of controlling electrical connection and electrical disconnection between the gate electrode and the source terminal of the transistor 101 controlling power output. Specifically, when the transistor 111 is on, the gate electrode and the source terminal of the transistor 101 are electrically connected, and the transistor 101 is turned off. When the transistor 111 is off, the gate electrode and the source terminal of the transistor 101 are electrically disconnected.

Thus, in the solid-state relay 100 in FIG. 1B according to the first structure of the present invention, the gate electrode and the source terminal of the transistor 101 controlling power output that are electrically disconnected can be electrically connected by switching of the transistor 111. Accordingly, switching of the solid-state relay 100 from a power output state into a power output stop state, that is, switching of the solid-state relay 100 from an on state to an off state can be performed at higher speed.

As in FIG. 1A, the capacitor 105 has a function of holding the potential applied to the gate electrode of the transistor 101 when the transistor 111 is off. Note that as described above, the solid-state relay 100 according to one embodiment of the present invention does not necessarily include the capacitor 105.

An oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

An oxide semiconductor film may be in a non-single-crystal state, for example. The non-single-crystal state is, for example, structured by at least one of c-axis aligned crystal (CAAC), polycrystal, microcrystal, and an amorphous part. Among c-axis aligned crystal (CAAC), polycrystal, microcrystal, and an amorphous part, the amorphous part has the highest density of defect states, whereas CAAC has the lowest density of defect states. Note that an oxide semiconductor including CAAC is referred to as a c-axis aligned crystalline oxide semiconductor (CAAC-OS).

For example, the oxide semiconductor film may include a CAAC-OS. In the CAAC-OS, for example, c-axes are aligned, and a-axes and/or b-axes are not macroscopically aligned.

For example, the oxide semiconductor film may include microcrystal. A microcrystalline oxide semiconductor film, for example, includes a microcrystal of greater than or equal to 1 nm and less than 10 nm.

For example, the oxide semiconductor film may include an amorphous part. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a layered structure including a region of an amorphous oxide semiconductor, a region of a microcrystalline oxide semiconductor, and a region of a CAAC-OS, for example.

Note that the oxide semiconductor film may be in a single-crystal state, for example.

The oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

In most cases, a crystal part in the CAAC-OS film fits into a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clear. Thus, in the CAAC-OS film, a reduction in electron mobility, due to the grain boundary, is inhibited.

In each of the crystal parts included in the CAAC-OS film, for example, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80 to 100°, preferably from 85 to 95°. In addition, the term "parallel" includes a range from −10 to 10°, preferably from −5 to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes might be different from each other depending on the shape of the CAAC-OS film (the cross-sectional shape of the surface where the CAAC-OS film is formed or the cross-sectional shape of the surface of the CAAC-OS film). Note that the c-axes of the crystal parts are aligned in the direction parallel to a normal vector of the surface where the CAAC-OS film is formed or a normal vector of the surface of the CAAC-OS film. The crystal part is formed by deposition or by crystallization treatment such as heat treatment after deposition.

With the use of the CAAC-OS film in a transistor, changes in electrical characteristics of the transistor due to irradiation with visible light or ultraviolet light is small. Thus, the transistor has high reliability.

For example, a CAAC-OS film is deposited by sputtering with a polycrystalline metal oxide target. When ions collide with the target, a crystal region included in the target may be separated from the target along the a-b plane, and a sputtered particle having a plane parallel to the a-b plane (a flat-plate-like sputtered particle or a pellet-like sputtered particle) might be separated from the target. In that case, the flat-plate-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100° C. or higher and 740° C. or lower, preferably 200° C. or higher and 500° C. or lower. By increasing the substrate heating temperature during the deposition, when the flat-plate-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined mole ratio, applying pressure, and performing heat treatment at 1000° C. or higher and 1500° C. or lower. Note that X, Y, and Z are each a given positive number. Here, the predetermined mole ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the mole ratio for mixing powder may be changed as appropriate depending on a target to be formed.

Note that in FIGS. 1A and 1B, the transistor 101 is a MOSFET. However, the transistor 101 can be an insulated gate bipolar transistor (IGBT), a metal semiconductor field effect transistor (MESFET), or the like. In the case where the transistor 101 is an IGBT, a source terminal and a drain terminal correspond to an emitter terminal and a collector terminal, respectively.

Instead of silicon, germanium, or the like, the transistor 101 may include an oxide semiconductor or gallium oxide in a channel formation region. In the case of a solid-state relay controlling output of high power, a transistor including an oxide semiconductor or gallium oxide is preferably used as the transistor 101 because its withstand voltage is high.

In FIGS. 1A and 1B, the number of the transistors 101 is only one; however, in the solid-state relay 100 according to one embodiment of the present invention, the number of the transistors 101 may be two or more. For example, by using the plurality of transistors 101 connected to each other in parallel, higher power can be controlled.

In this specification, a state in which transistors are connected to each other in parallel means a state in which one of a source terminal and a drain terminal of a first transistor is connected to one of a source terminal and a drain terminal of a second transistor and the other of the source terminal and the drain terminal of the first transistor is connected to the other of the source terminal and the drain terminal of the second transistor. In addition, a state in which transistors are connected to each other in series means a state in which only one of a source terminal and a drain terminal of a first transistor is connected to only one of a source terminal and a drain terminal of a second transistor.

In FIGS. 1A and 1B, the transistors 101, 104, and 111 each have a single-gate structure where one channel formation region corresponding to one gate electrode is provided. However, the transistor 101, 104, or 111 may have a multi-gate structure where a plurality of channel formation regions are formed by provision of a plurality of gate electrodes electrically connected to each other.

The transistor 101, 104, or 111 includes a gate electrode at least on one side of an active layer. Alternatively, the transistor may include a pair of gate electrodes with the active layer positioned therebetween. When the transistor includes a pair of gate electrodes with the active layer positioned therebetween, a signal for controlling switching may be supplied to one of the gate electrodes, and the other of the gate electrodes may be electrically isolated (floating) or may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor can be controlled.

(Embodiment 2)

Figure 2A:
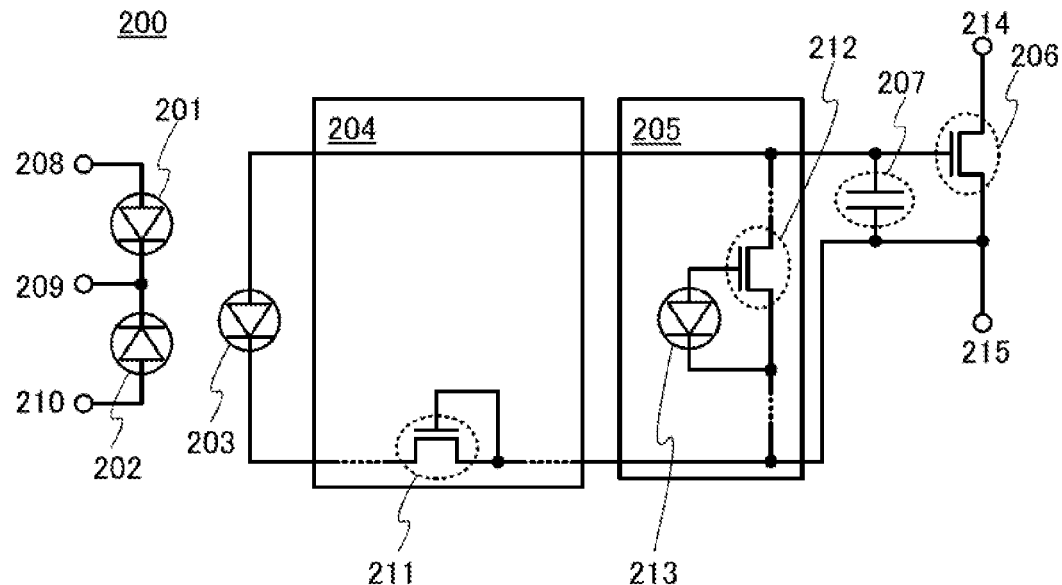
FIGS. 2A and 2B each illustrate a structure of a solid-state relay according to a second structure of the present invention.

FIG. 2A illustrates a structure example of a solid-state relay according to a second structure of the present invention. A solid-state relay 200 in FIG. 2A includes at least a first light-emitting element 201, a second light-emitting element 202, a first light-receiving element 203, a first switch 204, a second switch 205, a transistor 206, and a capacitor 207.

In the solid-state relay 200, forward voltage is applied between terminals 208 and 209 by application of the potential of a signal to one of the terminals 208 and 209 and application of a fixed potential to the other of the terminals 208 and 209. Then, the first light-emitting element 201 emits light. The first light-receiving element 203 generates electromotive force by reception of light emitted from the first light-emitting element 201. Thus, the first light-receiving element 203 can receive a signal from the first light-emitting element 201. Consequently, the first light-emitting element 201 and the first light-receiving element 203 correspond to a photocoupler, which is one of transmission circuits.

The first switch 204 has a function of applying a potential difference between a gate electrode and a source terminal of the transistor 206 controlling power output, in response to a signal received in the first light-receiving element 203 and holding the potential difference. Specifically, in the solid-state relay 200 in FIG. 2A, a transistor 211 in which one of a source terminal and a drain terminal is connected to a gate electrode is used in the first switch 204. The other of the source terminal and the drain terminal of the transistor 211 is connected to a cathode of the first light-receiving element 203. One of the source terminal and the drain terminal and the gate electrode of the transistor 211 are connected to the source terminal of the transistor 206.

The second switch 205 has a function of controlling electrical connection and electrical disconnection between the gate electrode and the source terminal of the transistor 206. Specifically, in the solid-state relay 200 in FIG. 2A, a transistor 212 and a second light-receiving element 213 are used in the second switch 205. A drain terminal of the transistor 212 is connected to the gate electrode of the transistor 206, and a source terminal of the transistor 212 is connected to the source terminal of the transistor 206. An anode of the second light-receiving element 213 is connected to a gate electrode of the transistor 212, and a cathode of the second light-receiving element 213 is connected to the source terminal of the transistor 212.

In the solid-state relay 200, forward voltage is applied between the terminal 209 and a terminal 210 by application of the potential of a signal to one of the terminals 209 and 210 and application of a fixed potential to the other of the terminals 209 and 210. Then, the second light-emitting element 202 emits light. The second light-receiving element 213 generates electromotive force by reception of light emitted from the second light-emitting element 202. Thus, the second light-receiving element 213 can receive a signal from the second light-emitting element 202. Consequently, the second light-emitting element 202 and the second light-receiving element 213 correspond to a photocoupler, which is one of transmission circuits.

Note that for example, each of the first light-emitting element 201 and the second light-emitting element 202 can be an electroluminescent element such as an OLED or a light-emitting diode (LED). Further, each of the first light-receiving element 203 and the second light-receiving element 213 can be a photodiode, a phototransistor, or the like.

In the first light-receiving element 203, the absolute sensitivity to light emitted from the first light-emitting element 201 is higher than the absolute sensitivity to light emitted from the second light-emitting element 202. Specifically, in the first light-receiving element 203, the unit amount of current or voltage generated based on the amount of light entering from the first light-emitting element 201 is larger than the unit amount of current or voltage generated based on the amount of light entering from the second light-emitting element 202. In the second light-receiving element 213, the absolute sensitivity to light emitted from the second light-emitting element 202 is higher than the absolute sensitivity to light emitted from the first light-emitting element 201. Specifically, in the second light-receiving element 213, the unit amount of current or voltage generated based on the amount of light entering from the second light-emitting element 202 is larger than the unit amount of current or voltage generated based on the amount of light entering from the first light-emitting element 201.

For example, in the case where the spectrum of light emitted from the first light-emitting element 201 has the highest peak in an infrared region and the spectrum of light emitted from the second light-emitting element 202 has the highest peak in an ultraviolet region, a light-receiving element having higher sensitivity to infrared light is preferably used as the first light-receiving element 203 and a light-receiving element having higher sensitivity to ultraviolet light is preferably used as the second light-receiving element 213. In this example, an AlGaAs light-emitting diode may be used as the first light-emitting element 201 and an AlGaN light-emitting diode may be used as the second light-emitting element 202. Further, an InGaAs PIN photodiode may be used as the first light-receiving element 203 and a Si photodiode may be used as the second light-receiving element 213.

Note that in the solid-state relay 200, the number of the first light-emitting elements 201, the number of the second light-emitting elements 202, the number of the first light-receiving elements 203, and the number of the second light-receiving elements 213 are each not necessarily one and may each be two or more. In the case where the number of the first light-emitting elements 201 or the number of the second light-emitting elements 202 is two or more, the light-emitting elements are connected to each other in series or in parallel so that the direction of forward currents is uniform. Further, in the case where the number of the first light-receiving elements 203 or the number of the second light-receiving elements 213 is two or more, the light-receiving elements are connected to each other in series or in parallel so that the direction of photocurrents generated by reception of light is uniform.

The source terminal of the transistor 206 is connected to a terminal 215 and a drain terminal of the transistor 206 is connected to a terminal 214. The transistor 206 has a function of controlling output of power from the solid-state relay 200 by electrically connecting or disconnecting the terminals 214 and 215. Specifically, when the transistor 206 is on, power is output from the solid-state relay 200 in response to voltage applied between the terminals 214 and 215. When the transistor 206 is off, output of power from the solid-state relay 200 is stopped regardless of the voltage applied between the terminals 214 and 215.

Note that the capacitor 207 has a function of holding the potential difference applied between the gate electrode and the source terminal of the transistor 206 when the first switch 204 and the second switch 205 are off. Specifically, the capacitor 207 is provided between the gate electrode of the transistor 206 and the terminal 215. Note that in the case where gate capacitance formed between the gate electrode and a semiconductor film of the transistor 206 or parasitic capacitance added to the gate electrode is high enough to hold a potential, the solid-state relay 200 according to one embodiment of the present invention does not necessarily include the capacitor 207.

In addition, in the solid-state relay 200 in FIG. 2A according to the second structure of the present invention, the off-state currents of the transistors 211 and 212 are extremely low. A transistor including a channel formation region containing a semiconductor that has a wide band gap and is highly purified by reduction of impurities such as moisture or hydrogen that serve as electron donors (donors) and reduction of oxygen vacancies has extremely low off-state current, and thus is preferably used as each of the transistors 211 and 212. Since the off-state currents of the transistors 211 and 212 are extremely low, the transistor 206 can be kept on by turning off the transistors 211 and 212 even when the first light-emitting element 201 does not emit light continuously. Consequently, the solid-state relay 200 outputs power continuously.

Note that in FIG. 2A, the other of the source terminal and the drain terminal of the transistor 211 is connected to the cathode of the first light-receiving element 203, and one of the source terminal and the drain terminal and the gate electrode of the transistor 211 is connected to the source terminal of the transistor 206; however, in the solid-state relay according to the second structure of the present invention, the transistor 211 may be provided between an anode of the first light-receiving element 203 and the gate electrode of the transistor 206 or between the cathode of the first light-receiving element 203 and the source terminal of the transistor 206. Thus, as illustrated in FIG. 2B, in the solid-state relay 200 according to the second structure of the present invention, one of the source terminal and the drain terminal and the gate electrode of the transistor 211 may be connected to the anode of the first light-receiving element 203, and the other of the source terminal and the drain terminal of the transistor 211 may be connected to the gate electrode of the transistor 206.

Figure 2B:
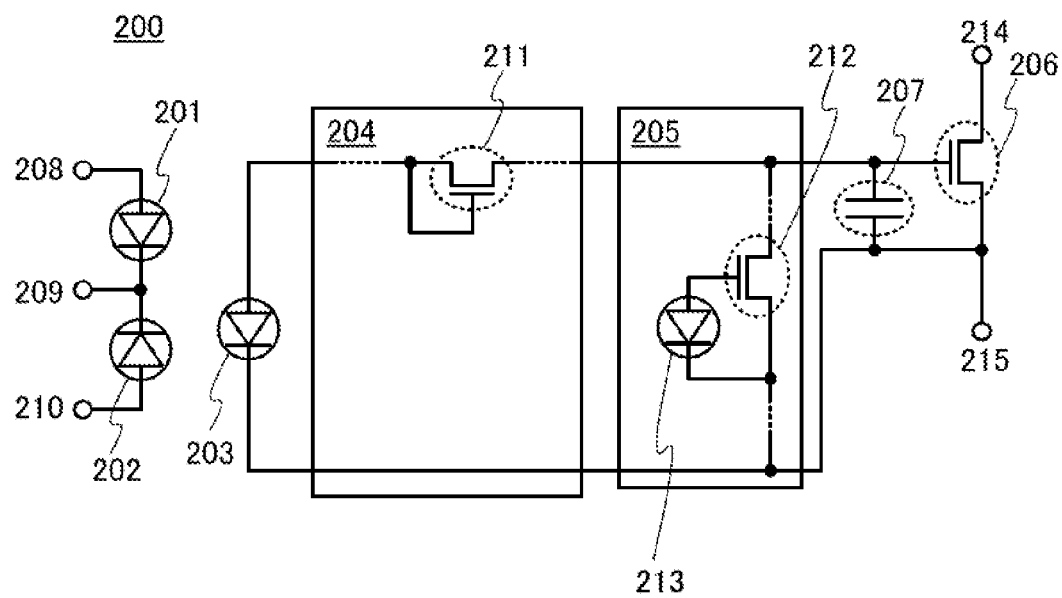

In the solid-state relay 200 in FIG. 2A or 2B, power output is controlled with one transistor 206; however, in the solid-state relay 200 according to one embodiment of the present invention, power output may be controlled with the plurality of transistors 206. For example, by using the plurality of transistors 206 connected to each other in parallel, higher power can be controlled.

Figure 3:
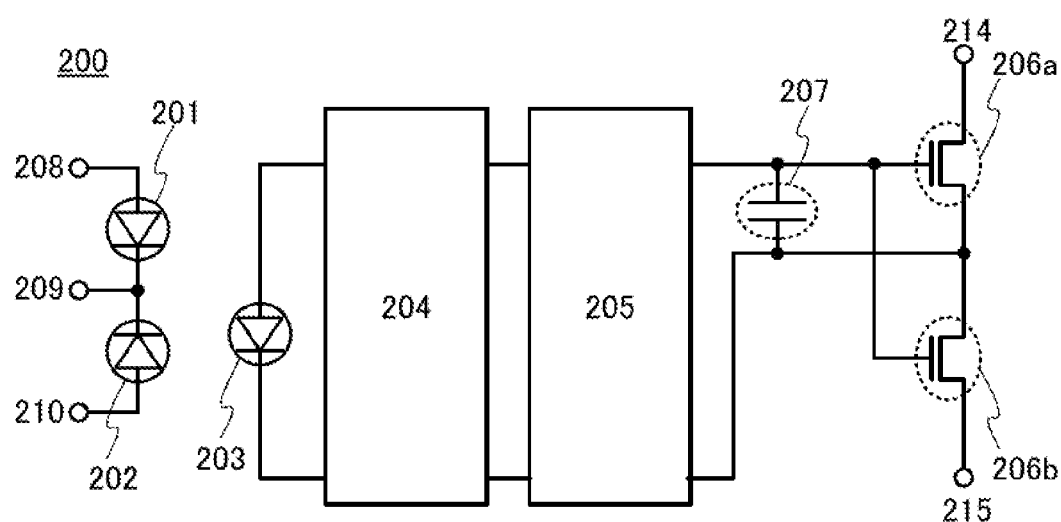
FIG. 3 illustrates a structure of the solid-state relay according to the second structure of the present invention.

FIG. 3 illustrates a structure example of the solid-state relay 200 in which two transistors 206 connected to each other in series are provided between the terminals 214 and 215. In FIG. 3, one of the two transistors 206 is referred to as a transistor 206a, and the other of the two transistors 206 is referred to as a transistor 206b. Gate electrodes of the transistors 206a and 206b are connected to each other, and source terminals of the transistors 206a and 206b are connected to each other. A drain terminal of the transistor 206a is connected to the terminal 214, and a drain terminal of the transistor 206b is connected to the terminal 215. In the solid-state relay 200 in FIG. 3, even when voltage applied to the terminals 214 and 215 is AC voltage, power output can be controlled.

Next, operation examples of the solid-state relay 200 according to the second structure of the present invention are described with reference to FIGS. 4A and 4B and FIGS. 5A and 5B. Note that in the solid-state relay 200 in FIGS. 4A and 4B and FIGS. 5A and 5B, the plurality of first light-receiving elements 203 are connected to each other in series so that the direction of forward currents is uniform, and the transistors 206a and 206b controlling power output are connected to each other in series. FIGS. 4A and 4B and FIGS. 5A and 5B also illustrate a reverse resistor of the second light-receiving element 213 as a resistor 216. Specifically, the resistor 216 is connected to the second light-receiving element 213 in parallel between the gate electrode and the source terminal of the transistor 212.

Figure 4A:
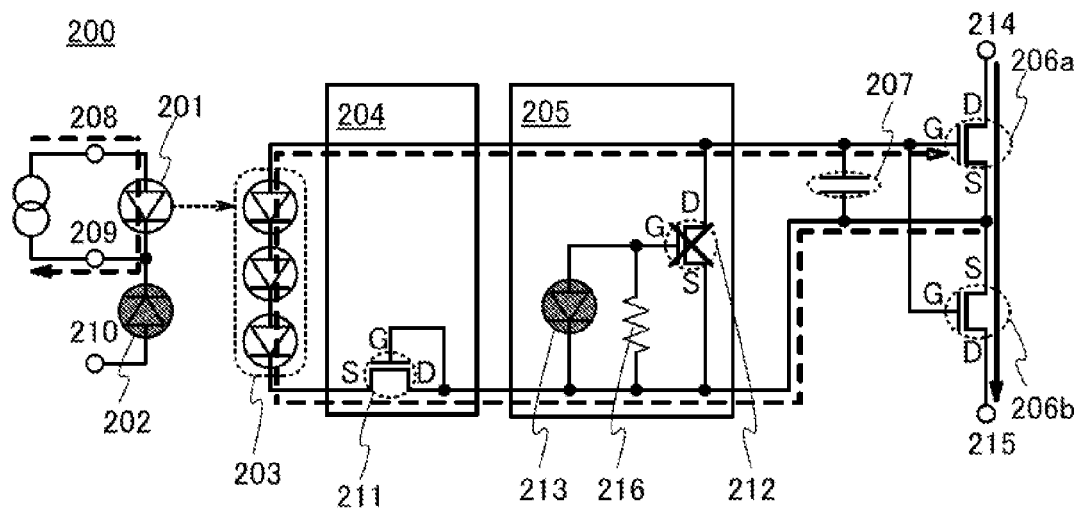
FIGS. 4A and 4B each illustrate operation of the solid-state relay according to the second structure of the present invention.

First, as illustrated in FIG. 4A, when the first light-emitting element 201 emits light, the first light-receiving elements 203 generate electromotive force and thus receive a signal from the first light-emitting element 201. Accordingly, as indicated by a broken arrow, current flows through the first light-receiving elements 203 in a reverse direction. The current makes the potential of a cathode side of each of the first light-receiving elements 203 lower than the potential of a source terminal side of each of the transistors 206a and 206b. Consequently, a terminal of the transistor 211 on the cathode side of each of the first light-receiving elements 203 is the source terminal, and a terminal of the transistor 211 on the source terminal side of each of the transistors 206a and 206b is the drain terminal. Thus, a potential difference is applied between the gate electrode and the source terminal of the transistor 211, so that the transistor 211 is turned on. Then, through the transistor 211 that is on, a potential difference is applied between the gate electrode and the source terminal of each of the transistors 206a and 206b by the electromotive force generated in the first light-receiving elements 203.

In addition, in FIG. 4A, the second light-emitting element 202 does not emit light. Accordingly, in the second switch 205, electromotive force is not generated in the second light-receiving element 213, and thus the transistor 212 is off. Consequently, between the gate electrode and the source terminal of each of the transistors 206a and 206b, the second switch 205 is off.

Thus, in FIG. 4A, the transistors 206a and 206b are turned on, and the terminals 214 and 215 are electrically connected. Consequently, as indicated by a solid arrow, power is output from the solid-state relay 200.

Figure 4B:
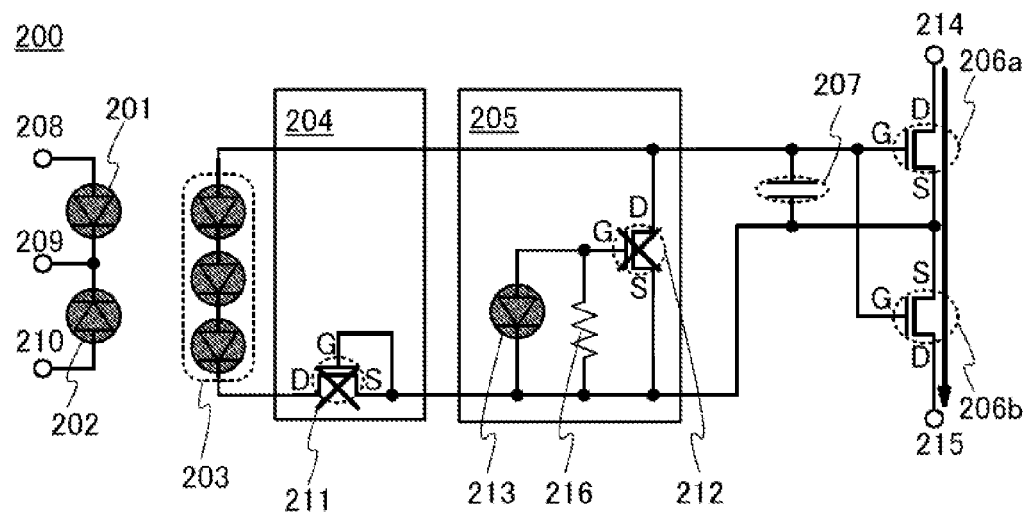

Next, as illustrated in FIG. 4B, when the first light-emitting element 201 does not emit light, the first light-receiving elements 203 stop generation of electromotive force, and thus the current flowing through the first light-receiving elements 203 in the reverse direction in FIG. 4A stops and starts to flow in the forward direction. The current makes the potential of the cathode side of each of the first light-receiving elements 203 higher than the potential of the source terminal side of each of the transistors 206a and 206b. Consequently, the terminal of the transistor 211 on the cathode side of each of the first light-receiving elements 203 is the drain terminal, and the terminal of the transistor 211 on the source terminal side of each of the transistors 206a and 206b is the source terminal. Thus, the gate electrode and the source terminal of the transistor 211 are connected to each other, so that the transistor 211 is turned off.

In addition, in FIG. 4B, the second light-emitting element 202 does not emit light. Accordingly, in the second switch 205, electromotive force is not generated in the second light-receiving element 213, and thus the transistor 212 is off. Consequently, between the gate electrode and the source terminal of each of the transistors 206a and 206b, the second switch 205 is off.

Note that as described above, in the solid-state relay 200 according to the second structure of the present invention, the off-state currents of the transistors 211 and 212 are extremely low. Thus, in the case where the transistors 211 and 212 are turned off, the potential difference applied between the gate electrode and the source terminal of each of the transistors 206a and 206b can be held even after generation of electromotive force in the first light-receiving elements 203 is stopped. Accordingly, the transistors 206a and 206b can be kept on even when the first light-emitting element 201 does not emit light continuously. Consequently, the terminals 214 and 215 are kept electrically connected, and the solid-state relay 200 outputs power continuously, as indicated by a solid arrow.

Figure 5A:
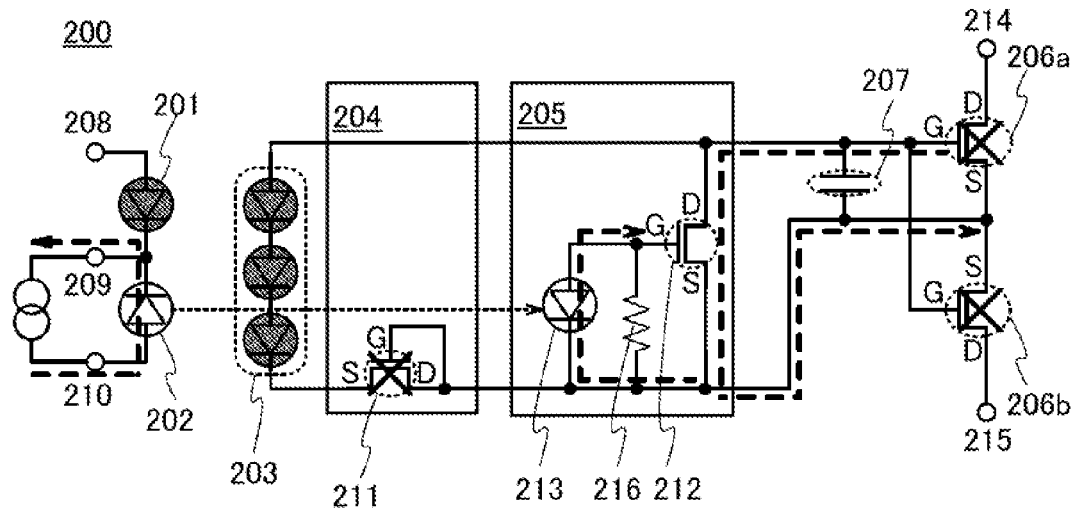
FIGS. 5A and 5B each illustrate operation of the solid-state relay according to the second structure of the present invention.

Next, as illustrated in FIG. 5A, when the second light-emitting element 202 emits light, in the second switch 205, the second light-receiving element 213 generates electromotive force. Accordingly, as indicated by a broken arrow, current flows through the second light-receiving element 213 in a reverse direction. Then, a potential difference is applied between the gate electrode and the source terminal of the transistor 212 by the electromotive force generated in the second light-receiving element 213, so that the transistor 212 (i.e., the second switch 205) is turned on. Then, through the second switch 205 that is on, the gate electrode and the source terminal of each of the transistors 206a and 206b are electrically connected.

Thus, in FIG. 5A, the transistors 206a and 206b are turned off, and the terminals 214 and 215 are electrically disconnected. Consequently, output of power from the solid-state relay 200 is stopped.

In the solid-state relay 200 according to the second structure of the present invention, as illustrated in FIG. 4B, the potential difference applied between the gate electrode and the source terminal of each of the transistors 206a and 206b controlling power output is held even after generation of electromotive force in the first light-receiving elements 203 is stopped. However, in the solid-state relay 200 according to the second structure of the present invention, as illustrated in FIG. 5A, by using electromotive force in the second light-receiving element 213, the gate electrode and the source terminal of each of the transistors 206a and 206b that are electrically disconnected can be electrically connected instantaneously. Thus, regardless of whether the first light-emitting element 201 emits light continuously, output of power from the solid-state relay 200 can be stopped instantaneously.

Note that in FIG. 5A, the first light-emitting element 201 does not emit light. Accordingly, in the first switch 204, electromotive force is not generated in the first light-receiving elements 203, and thus the transistor 211 is off. Consequently, between the gate electrode and the source terminal of each of the transistors 206a and 206b, the first switch 204 is off.

Figure 5B:
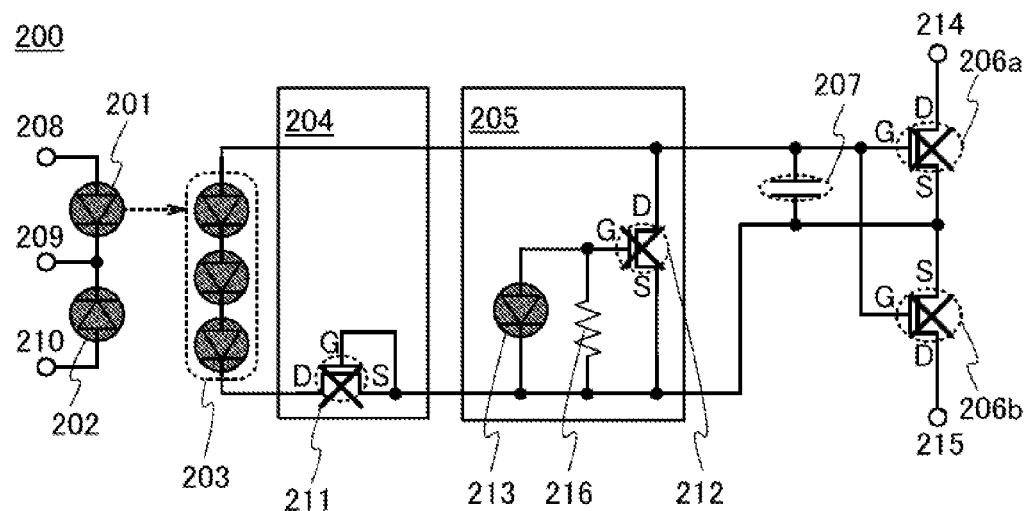

Next, as illustrated in FIG. 5B, when the second light-emitting element 202 does not emit light, in the second switch 205, generation of electromotive force in the second light-receiving element 213 is stopped. Accordingly, the transistor 212 (i.e., the second switch 205) is turned off.

Note that in FIG. 5B, the first light-emitting element 201 does not emit light. Accordingly, in the first switch 204, electromotive force is not generated in the first light-receiving elements 203, and thus the transistor 211 is off. Consequently, between the gate electrode and the source terminal of each of the transistors 206a and 206b, the first switch 204 is off.

Thus, in FIG. 5B, the transistors 206a and 206b are kept off, and the portion between the terminals 214 and 215 are kept electrically disconnected. Consequently, output of power from the solid-state relay 200 remains stopped.

Figure 6:
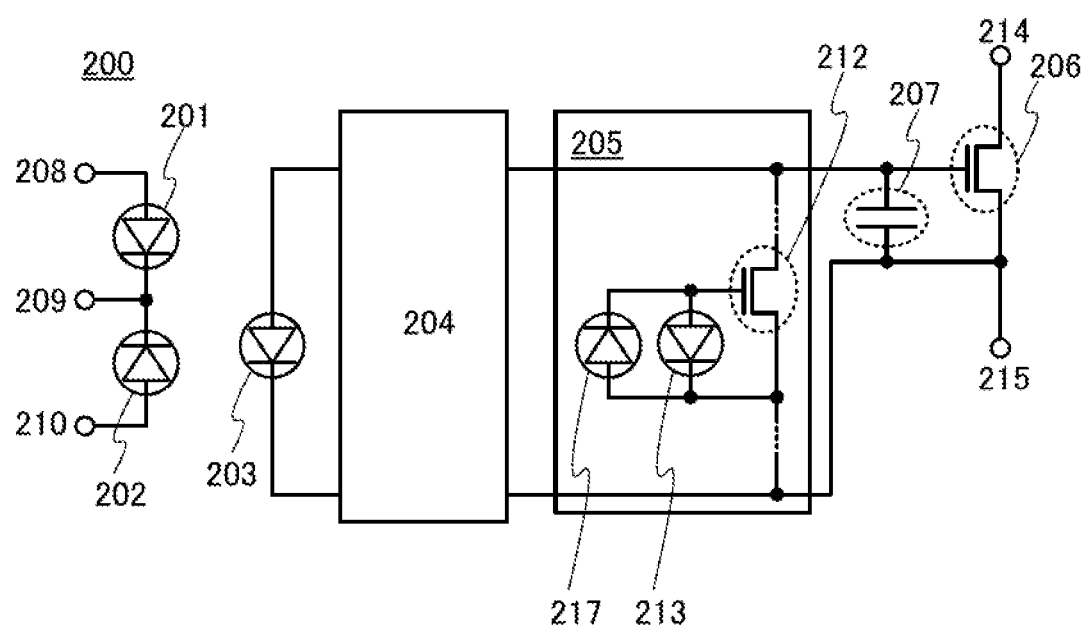
FIG. 6 illustrates a structure of the solid-state relay according to the second structure of the present invention.

Note that in the solid-state relay 200 according to the second structure of the present invention, in the second switch 205, a third light-receiving element may be provided between the gate electrode and the source terminal of the transistor 212. FIG. 6 illustrates the structure of the solid-state relay 200 in which a third light-receiving element 217 is provided in the second switch 205.

In the solid-state relay 200 in FIG. 6, the third light-receiving element 217 is connected to the second light-receiving element 213 in parallel between the gate electrode and the source terminal of the transistor 212. In addition, the anode of the second light-receiving element 213 is connected to a cathode of the third light-receiving element 217, and an anode of the third light-receiving element 217 is connected to the cathode of the second light-receiving element 213. Further, like the first light-receiving element 203, the third light-receiving element 217 generates electromotive force by reception of light emitted from the first light-emitting element 201.

Note that the number of the third light-receiving elements 217 is not necessarily one and may be two or more.

In the solid-state relay 200 in FIG. 6, since the third light-receiving element 217 is provided in the second switch 205, when the state of the first light-emitting element 201 is changed from a non-light emission state into a light emission state, the transistor 212 can be switched from an on state to an off state instantaneously by electromotive force generated in the third light-receiving element 217. Thus, output of power from the solid-state relay 200 can be started instantaneously.

Next, structure examples of the first switch 204 included in the solid-state relay 200 are described with reference to FIGS. 7A to 7D. Note that FIGS. 7A to 7D illustrate a terminal on the cathode side of the first light-receiving element 203, a terminal on a source terminal side of the transistor 206, a terminal on an anode side of the first light-receiving element 203, and a terminal on a gate electrode side of the transistor 206. These terminals are referred to as a terminal T1, a terminal T2, a terminal T3, and a terminal T4, respectively.

Figure 7A:
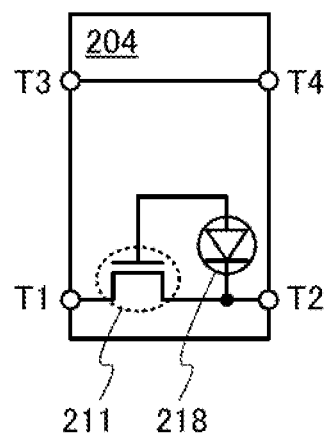
FIGS. 7A to 7D illustrate structure examples of a first switch.

The first switch 204 in FIG. 7A includes a fourth light-receiving element 218 in addition to the transistor 211. Specifically, one of the source terminal and the drain terminal of the transistor 211 is connected to the terminal T1, and the other of the source terminal and the drain terminal of the transistor 211 is connected to the terminal T2. An anode of the fourth light-receiving element 218 is connected to the gate electrode of the transistor 211, and a cathode of the fourth light-receiving element 218 is connected to the terminal T2.

The fourth light-receiving element 218 generates electromotive force by reception of light emitted from the first light-emitting element 201.

Note that the number of the fourth light-receiving elements 218 is not necessarily one and may be two or more.

Figure 7B:
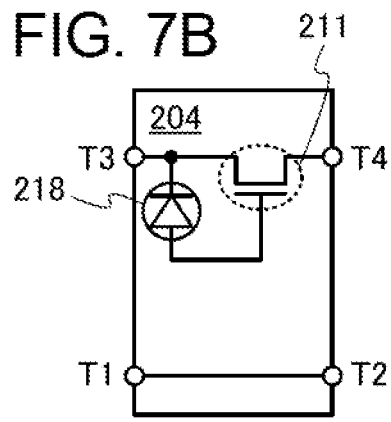

The first switch 204 in FIG. 7B includes the fourth light-receiving element 218 in addition to the transistor 211, as in FIG. 7A. Note that in FIG. 7B, one of the source terminal and the drain terminal of the transistor 211 is connected to the terminal T3, and the other of the source terminal and the drain terminal of the transistor 211 is connected to the terminal T4. The anode of the fourth light-receiving element 218 is connected to the gate electrode of the transistor 211, and the cathode of the fourth light-receiving element 218 is connected to the terminal T3. The fourth light-receiving element 218 generates electromotive force by reception of light emitted from the first light-emitting element 201.

Since the first switch 204 in FIGS. 7A and 7B includes the fourth light-receiving element 218, a potential difference between the source terminal and the drain terminal can be small. Thus, even when electromotive force generated in the first light-receiving element 203 is weaker, the transistor 211 can be turned on.

Figure 7C:
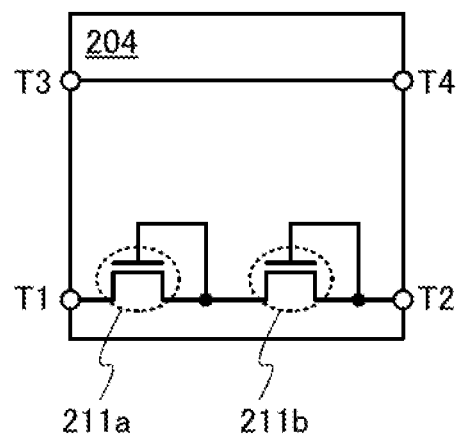

The first switch 204 in FIG. 7C includes transistors 211a and 211b. Specifically, one of a source terminal and a drain terminal of the transistor 211a is connected to the terminal T1, and the other of the source terminal and the drain terminal of the transistor 211a is connected to a gate electrode of the transistor 211a. One of a source terminal and a drain terminal of the transistor 211b is connected to the gate electrode of the transistor 211a, and the other of the source terminal and the drain terminal of the transistor 211b is connected to the terminal T2.

Figure 7D:
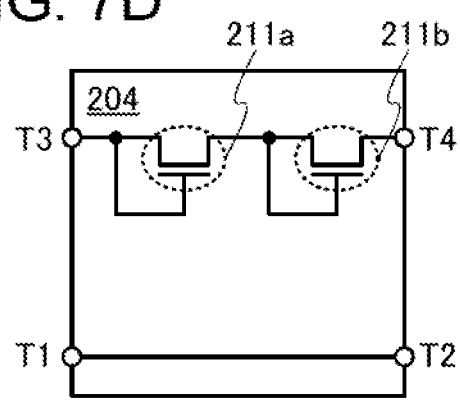

As in FIG. 7C, the first switch 204 in FIG. 7D includes the transistors 211a and 211b. Specifically, one of the source terminal and the drain terminal of the transistor 211a is connected to the terminal T3 and the gate electrode of the transistor 211a, and the other of the source terminal and the drain terminal of the transistor 211a is connected to a gate electrode of the transistor 211b. One of the source terminal and the drain terminal of the transistor 211b is connected to the gate electrode of the transistor 211b, and the other of the source terminal and the drain terminal of the transistor 211b is connected to the terminal T4.

Figure 8A:
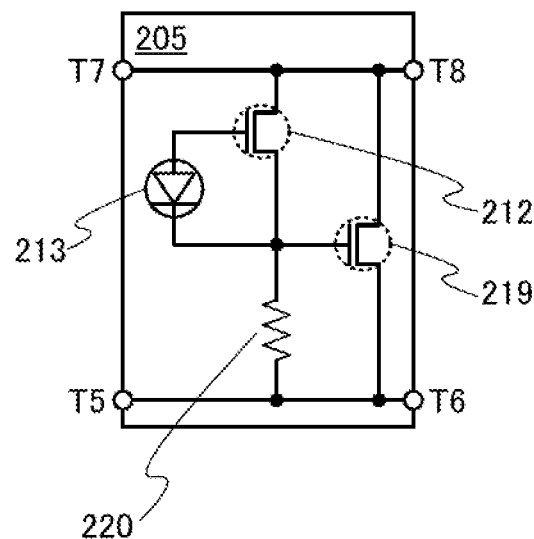
FIGS. 8A and 8B illustrate structure examples of a second switch.
Figure 8B:
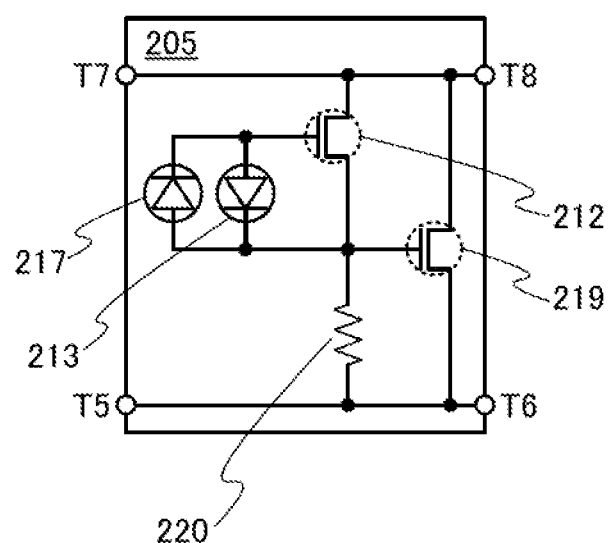

Next, structure examples of the second switch 205 included in the solid-state relay 200 are described with reference to FIGS. 8A and 8B. Note that FIGS. 8A and 8B illustrate a terminal connected to the cathode of the first light-receiving element 203 through the first switch 204, a terminal on the source terminal side of the transistor 206, a terminal connected to the cathode of the first light-receiving element 203 through the first switch 204, and a terminal on the gate electrode side of the transistor 206. These terminals are referred to as a terminal T5, a terminal T6, a terminal T7, and a terminal T8, respectively.

The second switch 205 in FIG. 8A includes a transistor 219 and a resistor 220 in addition to the transistor 212 and the second light-receiving element 213. Specifically, the source terminal of the transistor 212 and the cathode of the second light-receiving element 213 are connected to a gate electrode of the transistor 219. A source terminal of the transistor 219 is connected to the terminals T5 and T6, and a drain terminal of the transistor 219 is connected to the terminals T7 and T8. The resistor 220 is connected between the gate electrode of the transistor 219 and the terminals T5 and T6.

In the second switch 205 in FIG. 8A, when electromotive force is generated in the second light-receiving element 213, the transistor 212 is turned on, so that current flows. When the current flows through the resistor 220, a potential difference is generated between the gate electrode and the source terminal of the transistor 219, so that the transistor 219 is turned on. This structure makes the terminals T6 and T8 electrically connected.

The second switch 205 in FIG. 8B is obtained by addition of the third light-receiving element 217 to the second switch 205 in FIG. 8A. Specifically, the third light-receiving element 217 is connected to the second light-receiving element 213 in parallel between the gate electrode and the source terminal of the transistor 212. In addition, the anode of the second light-receiving element 213 is connected to the cathode of the third light-receiving element 217, and the anode of the third light-receiving element 217 is connected to the cathode of the second light-receiving element 213. Further, like the first light-receiving element 203, the third light-receiving element 217 generates electromotive force by reception of light emitted from the first light-emitting element 201.

In the second switch 205 in FIGS. 8A and 8B, by using a transistor having a higher channel width-to-channel length ratio than the transistor 212 as the transistor 219, the transistor 219 can have higher on-state current than the transistor 212. Thus, even when electromotive force generated in the second light-receiving element 213 is weak, high current can flow between the terminals T8 and T6 through the transistor 219. Accordingly, in the solid-state relay 200, switching from an on state to an off state can be performed at higher speed and power needed for the switching can be reduced.

In the second switch 205 in FIG. 8B, since the third light-receiving element 217 is provided in the second switch 205, when the state of the first light-emitting element 201 is changed from a non-light emission state into a light emission state, the transistor 212 can be switched from an on state to an off state instantaneously by electromotive force generated in the third light-receiving element 217.

Note that in this embodiment, each of the transistors 206, 206a, and 206b is a MOSFET. However, each of the transistors 206, 206a, and 206b can be an IGBT, a MESFET, or the like. In the case where each of the transistors 206, 206a, and 206b is an IGBT, a source terminal and a drain terminal correspond to an emitter terminal and a collector terminal, respectively.

Instead of silicon, germanium, or the like, each of the transistors 206, 206a, and 206b may include an oxide semiconductor or gallium oxide in a channel formation region. In the case of a solid-state relay controlling output of high power, a transistor including an oxide semiconductor or gallium oxide is preferably used as each of the transistors 206, 206a, and 206b because its withstand voltage is high.

In the drawings shown in this embodiment, the transistors each have a single-gate structure where one channel formation region corresponding to one gate electrode is provided. However, at least one of the transistors included in the solid-state relay 200 may have a multi-gate structure where a plurality of channel formation regions are formed by provision of a plurality of gate electrodes electrically connected to each other.

In the drawings shown in this embodiment, the transistors each include a gate electrode on one side of an active layer. However, at least one of the transistors included in the solid-state relay 200 may include a pair of gate electrodes with the active layer positioned therebetween. When the transistor includes a pair of gate electrodes with the active layer positioned therebetween, a signal for controlling switching may be supplied to one of the gate electrodes, and the other of the gate electrodes may be electrically isolated (floating) or may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor can be controlled.

This embodiment can be combined with any of the other embodiments as appropriate.

(Embodiment 3)

A structure example of an inverter that is one of semiconductor devices including the solid-state relay according to one embodiment of the present invention is described.

Figure 9:
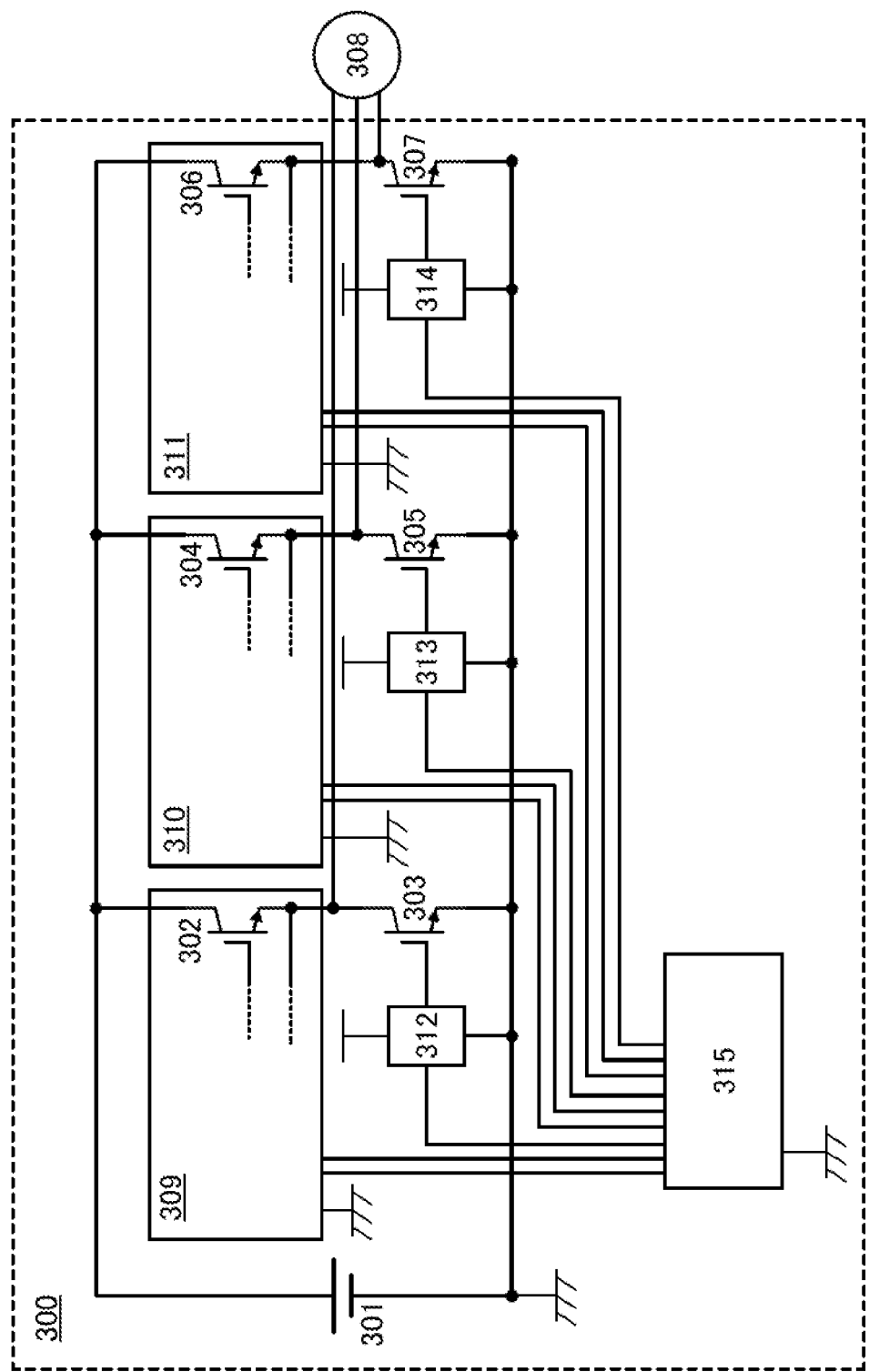
FIG. 9 illustrates a structure example of an inverter.

An inverter 300 in FIG. 9 corresponds to a three-phase inverter and includes a power source 301 and solid-state relays 309 to 311 according to one embodiment of the present invention. FIG. 9 illustrates a transistor 302 controlling output of a high-level potential applied from the power source 301 in the solid-state relay 309. FIG. 9 also illustrates a transistor 304 controlling output of a high-level potential applied from the power source 301 in the solid-state relay 310. FIG. 9 also illustrates a transistor 306 controlling output of a high-level potential applied from the power source 301 in the solid-state relay 311.

The inverter 300 in FIG. 9 further includes a transistor 303 connected to the transistor 302 in series, a transistor 305 connected to the transistor 304 in series, and a transistor 307 connected to the transistor 306 in series.

Note that although each of the transistors 302 to 307 is an IGBT in FIG. 9, each of the transistors 302 to 307 may be a MOSFET.

A high-level potential is applied from the power source 301 to collector terminals of the transistors 302, 304 and 306. In addition, a low-level potential is applied from the power source 301 to emitter terminals of the transistors 303, 305 and 307.

The potential of an emitter terminal of the transistor 302 and a collector terminal of the transistor 303 is applied to a load 308 as an output potential of the inverter 300. The potential of an emitter terminal of the transistor 304 and a collector terminal of the transistor 305 is also applied to the load 308 as an output potential of the inverter 300. The potential of an emitter terminal of the transistor 306 and a collector terminal of the transistor 307 is also applied to the load 308 as an output potential of the inverter 300.

The inverter 300 further includes a voltage control circuit 312 controlling voltage applied between a gate electrode and the emitter terminal of the transistor 303, a voltage control circuit 313 controlling voltage applied between a gate electrode and the emitter terminal of the transistor 305, and a voltage control circuit 314 controlling voltage applied between a gate electrode and the emitter terminal of the transistor 307.

The inverter 300 further includes a controller 315. The controller 315 has a function of controlling input of signals to the solid-state relays 309 to 311. In the solid-state relay 309, by controlling voltage between the gate electrode and the emitter terminal of the transistor 302 in response to a signal input from the controller 315, power is output to the load 308. In the solid-state relay 310, by controlling voltage between the gate electrode and the emitter terminal of the transistor 304 in response to a signal input from the controller 315, power is output to the load 308. In the solid-state relay 311, by controlling voltage between the gate electrode and the emitter terminal of the transistor 306 in response to a signal input from the controller 315, power is output to the load 308.

Signals are transmitted wirelessly in the solid-state relays 309 to 311. Thus, the controller 315 and the power source 301 are insulated in the solid-state relays 309 to 311, so that the controller 315 can be prevented from being broken by short-circuit or the like.

In addition, the solid-state relays 309 to 311 according to one embodiment of the present invention can perform switching at high speed, so that the high-performance inverter 300 can be obtained. In the case where the solid-state relays 309 to 311 each have the second structure of the present invention, the high-performance low-power inverter 300 can be obtained.

This embodiment can be combined with any of the other embodiments as appropriate.

(Embodiment 4)

Figure 10:
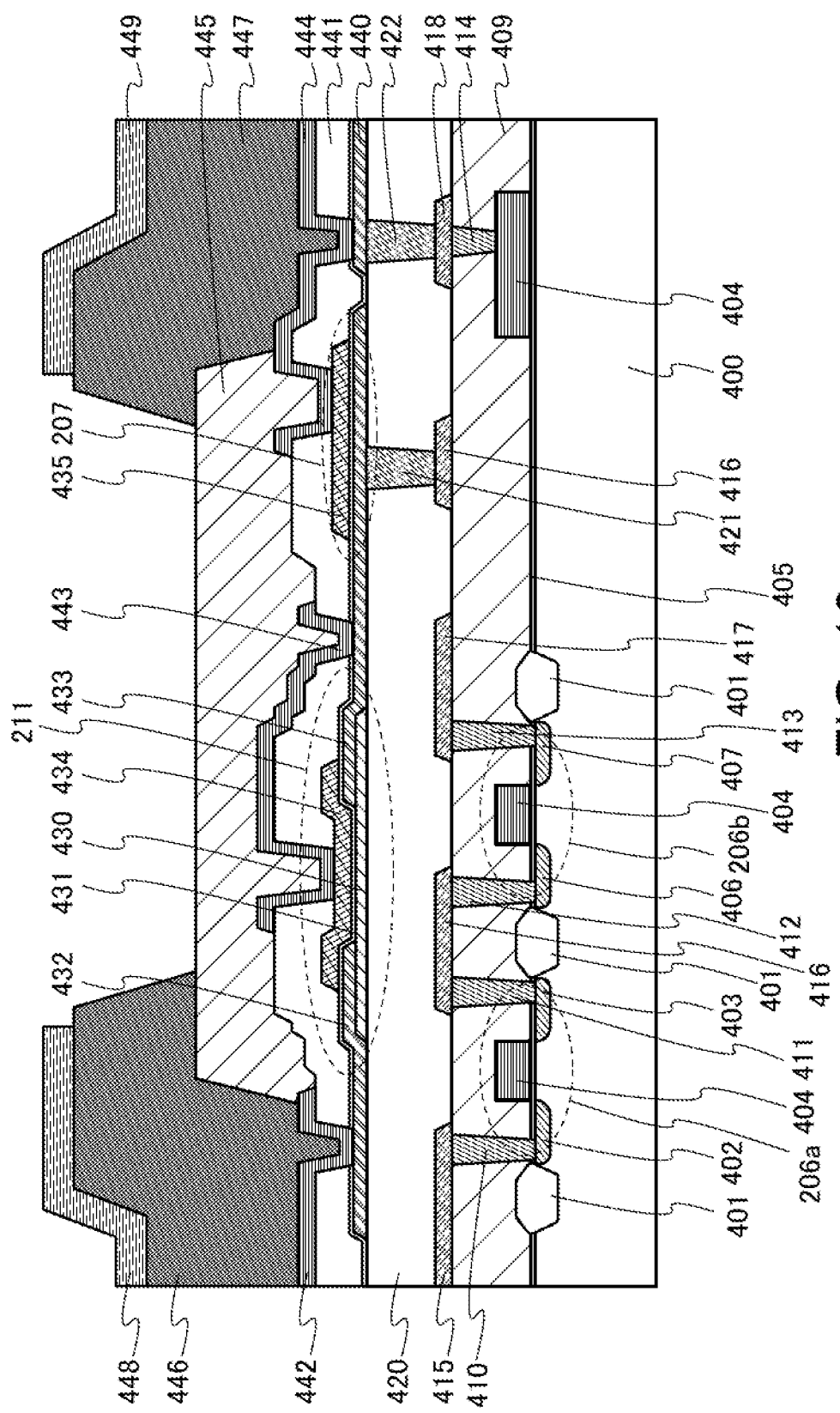
FIG. 10 is a cross-sectional view of a solid-state relay.

FIG. 10 illustrates an example of part of a cross-sectional structure of a solid-state relay according to one embodiment of the present invention. Note that FIG. 10 illustrates the transistors 211, 206a, and 206b and the capacitor 207 in the solid-state relay 200 in FIGS. 4A and 4B and FIGS. 5A and 5B.

In this embodiment, the transistors 206a and 206b are formed in a single crystal silicon substrate, and the transistor 211 including an active layer containing an oxide semiconductor is formed above the transistors 206a and 206b. The transistors 206a and 206b may each include a semiconductor thin film of silicon, germanium, or the like in an amorphous, microcrystalline, polycrystalline, or signal crystal state as an active layer. Alternatively, the transistors 206a and 206b may each include an active layer containing an oxide semiconductor. In the case where the transistors each include an active layer containing an oxide semiconductor, the transistor 211 is not necessarily stacked above the transistors 206a and 206b, and the transistors 211, 206a, and 206b may be formed over the same insulating surface.

In the case where the transistors 206a and 206b may each be formed using a thin silicon film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

In FIG. 10, the n-channel transistors 206a and 206b are formed in a semiconductor substrate 400.

The semiconductor substrate 400 can be, for example, a single crystal silicon substrate having n-type or p-type conductivity, or a compound semiconductor substrate (e.g., a GaAs substrate, an InP substrate, a GaN substrate, a SiC substrate, or a ZnSe substrate). FIG. 10 illustrates an example in which a single crystal silicon substrate having n-type conductivity is used.

The transistors 206a and 206b are electrically isolated from each other by an element isolation insulating film 401. The element isolation insulating film 401 can be formed by a local oxidation of silicon (LOCOS) method, a trench isolation method, or the like.

In the case where a semiconductor substrate having p-type conductivity is used, an impurity element imparting n-type conductivity may be selectively introduced into regions where the transistors 206a and 206b are formed, so that n-wells may be formed.

Specifically, the transistor 206a includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps with a channel formation region formed between the impurity regions 402 and 403 with the gate insulating film 405 positioned between the gate electrode 404 and the channel formation region.

Specifically, the transistor 206b includes impurity regions 406 and 407 that are formed in the semiconductor substrate 400 and function as a source region and a drain region, the gate electrode 404, and the gate insulating film 405 provided between the semiconductor substrate 400 and the gate electrode 404. The gate electrode 404 overlaps with a channel formation region formed between the impurity regions 406 and 407 with the gate insulating film 405 positioned between the gate electrode 404 and the channel formation region.

An insulating film 409 is provided over the transistors 206a and 206b. Openings are formed in the insulating film 409, and wirings 410 to 414 that are in contact with the impurity region 402, the impurity region 403, the impurity region 406, the impurity region 407, and the gate electrode 404, respectively, are formed in the openings.

The wiring 410 is connected to a wiring 415 formed over the insulating film 409. The wirings 411 and 412 are connected to a wiring 416 formed over the insulating film 409. The wiring 413 is connected to a wiring 417 formed over the insulating film 409. The wiring 414 is connected to a wiring 418 formed over the insulating film 409.

An insulating film 420 is formed over the wirings 415 to 418. Openings are formed in the insulating film 420. In the openings, a wiring 421 connected to the wiring 416 and a wiring 422 connected to the wiring 418 are formed.

In FIG. 10, the transistor 211 and the capacitor 207 are formed over the insulating film 420.

The transistor 221 includes, over the insulating film 420, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that overlaps with the semiconductor film 430 between the conductive films 432 and 433 with the gate insulating film 431 positioned between the gate electrode 434 and the semiconductor film 430.

The conductive film 433 is in contact with the wiring 421.

A conductive film 435 is provided over the gate insulating film 431 to overlap with the conductive film 433. A portion where the conductive films 433 and 435 overlap with each other with the gate insulating film 431 positioned therebetween functions as the capacitor 207.

Note that FIG. 10 illustrates an example in which the capacitor 207 is provided over the insulating film 420 together with the transistor 211. However, the capacitor 207 may be provided below the insulating film 420 together with the transistors 206a and 206b.

A conductive film 440 is provided over the insulating film 420 and is connected to the wiring 422.

An insulating film 441 is provided over the transistor 211, the capacitor 207, and the conductive film 440. Openings are provided in the insulating film 441 and the gate insulating film 431. Over the insulating film 441, a conductive film 442 that is in contact with the conductive film 432 through the opening, a conductive film 443 that is in contact with the gate electrode 434 and the conductive film 433 through the opening, and a conductive film 444 that is in contact with the conductive films 435 and 440 through the opening are provided.

An insulating film 445 is provided over the insulating film 441 and the conductive films 442 to 444. Openings are provided in the insulating film 445. Over the insulating film 445, a conductive film 446 that is in contact with the conductive film 442 through the opening and a conductive film 447 that is in contact with the conductive film 444 through the opening are provided. The conductive films 446 and 447 preferably have high surface flatness in order to connect terminals of a light-receiving element later. Thus, a resin in which conductive particles are dispersed is suitable for the material of each of the conductive films 446 and 447. Note that the resin has low adhesion to a solder; thus, a conductive film 448 is formed using a conductive material having high adhesion to a solder to be in contact with the conductive film 446, and a conductive film 449 is formed using a conductive material having high adhesion to a solder to be in contact with the conductive film 447.

By connecting the conductive film 448 to the cathode of the first light-receiving element and connecting the conductive film 449 to the anode of the first light-receiving element, the solid-state relay 200 according to one embodiment of the present invention can be obtained.

Note that in FIG. 10, the transistor 211 includes the gate electrode 434 on at least one side of the semiconductor film 430. Alternatively, the transistor 211 may include a pair of gate electrodes with the semiconductor film 430 positioned therebetween.

When the transistor 211 includes a pair of gate electrodes with the semiconductor film 430 positioned therebetween, a signal for controlling an on state or an off state may be supplied to one of the gate electrodes, and the other of the gate electrodes may be electrically isolated (floating) or may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor can be controlled.

This embodiment can be combined with any of the other embodiments as appropriate.

(Embodiment 5)

Next, structure examples of transistors each including an oxide semiconductor film are described.

Figure 11A:
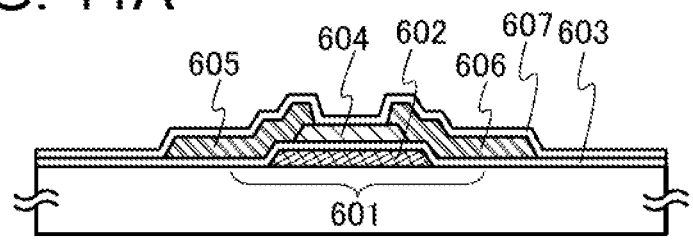
FIGS. 11A to 11D illustrate structures of transistors.

A transistor 601 in FIG. 11A is a bottom-gate transistor with a channel-etched structure.

The transistor 601 includes a gate electrode 602 formed over an insulating surface, a gate insulating film 603 over the gate electrode 602, an oxide semiconductor film 604 over the gate insulating film 603 that functions as an active layer and overlaps with the gate electrode 602, and conductive films 605 and 606 formed over the oxide semiconductor film 604. The transistor 601 may further include an insulating film 607 formed over the oxide semiconductor film 604 and the conductive films 605 and 606.

Note that the transistor 601 in FIG. 11A may further include a gate electrode formed over the insulating film 607 in a position that overlaps with the oxide semiconductor film 604.

Figure 11B:
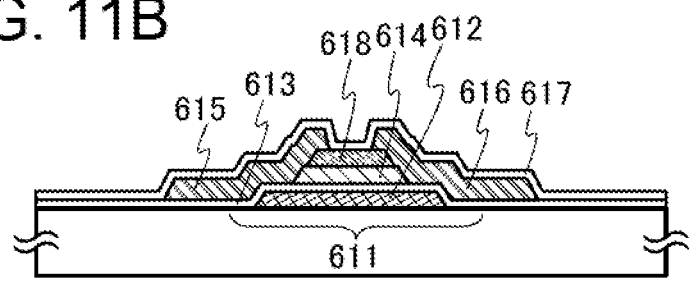

A transistor 611 in FIG. 11B is a bottom-gate transistor with a channel-protective structure.

The transistor 611 includes a gate electrode 612 formed over an insulating surface, a gate insulating film 613 over the gate electrode 612, an oxide semiconductor film 614 over the gate insulating film 613 that functions as an active layer and overlaps with the gate electrode 612, a channel protective film 618 formed over the oxide semiconductor film 614, and conductive films 615 and 616 formed over the oxide semiconductor film 614. The transistor 611 may further include an insulating film 617 formed over the channel protective film 618 and the conductive films 615 and 616.

Note that the transistor 611 in FIG. 11B may further include a gate electrode formed over the insulating film 617 in a position that overlaps with the oxide semiconductor film 614.

The channel protective film 618 can prevent a portion of the oxide semiconductor film 614 that serves as a channel formation region from being damaged in a later step, for example, a reduction in thickness due to plasma or an etchant during etching. Thus, the reliability of the transistor 611 can be improved.

Figure 11C:
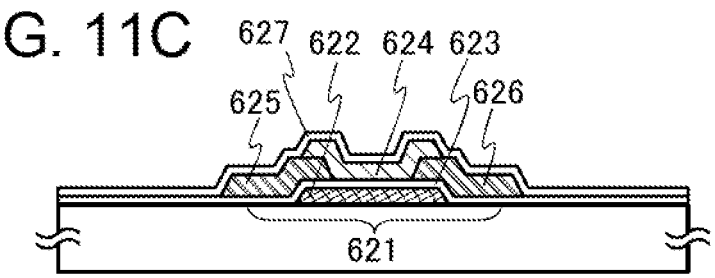

A transistor 621 in FIG. 11C is a bottom-gate transistor with a bottom-contact structure.

The transistor 621 includes a gate electrode 622 over an insulating surface, a gate insulating film 623 over the gate electrode 622, conductive films 625 and 626 over the gate insulating film 623, and an oxide semiconductor film 624 over the gate insulating film 623 that overlaps with the gate electrode 622, is formed over the conductive films 625 and 626, and functions as an active layer. The transistor 621 may further include an insulating film 627 formed over the conductive films 625 and 626 and the oxide semiconductor film 624.

Note that the transistor 621 in FIG. 11C may further include a gate electrode formed over the insulating film 627 in a position that overlaps with the oxide semiconductor film 624.

Figure 11D:
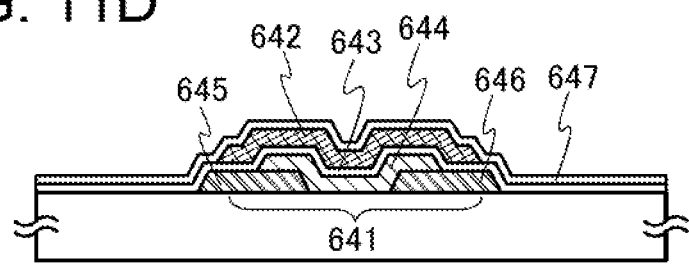

A transistor 641 in FIG. 11D is a top-gate transistor with a bottom-contact structure.

The transistor 641 includes conductive films 645 and 646 over an insulating surface, an oxide semiconductor film 644 over the conductive films 645 and 646 that functions as an active layer, a gate insulating film 643 formed over the oxide semiconductor film 644, and a gate electrode 642 over the gate insulating film 643 that overlaps with the oxide semiconductor film 644. The transistor 641 may further include an insulating film 647 formed over the gate electrode 642.

This embodiment can be combined with any of the other embodiments as appropriate.

(Embodiment 6)

A solid-state relay according to one embodiment of the present invention has features of high reliability and long lifetime that a mechanical relay cannot easily have. Further, the solid-state relay can perform switching at high speed. Thus, the solid-state relay according to one embodiment of the present invention is suitable for an electronic device in which the number of switchings of a power source is large. Furthermore, the solid-state relay according to one embodiment of the present invention operates at low power. Accordingly, in the case of a portable electronic device which has difficulty in receiving power at all times, an advantage of an increase in continuous operating time can be obtained when the solid-state relay according to one embodiment of the present invention is added as a component of the electronic device.

Figure 12A:
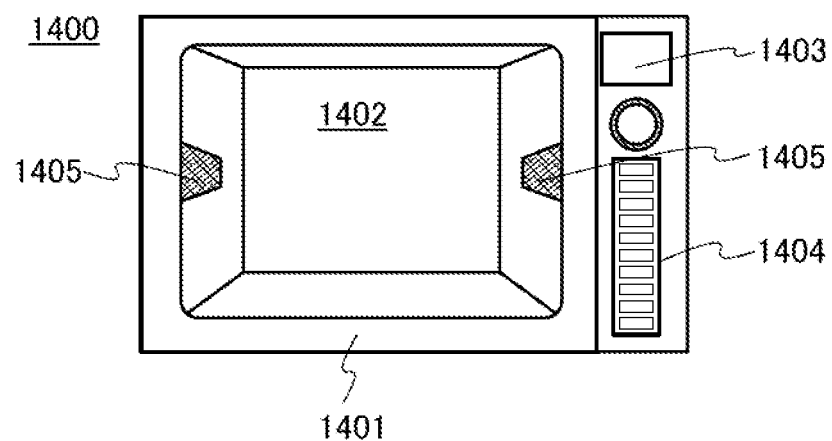
FIGS. 12A and 12B illustrate electronic devices.
Figure 12B:
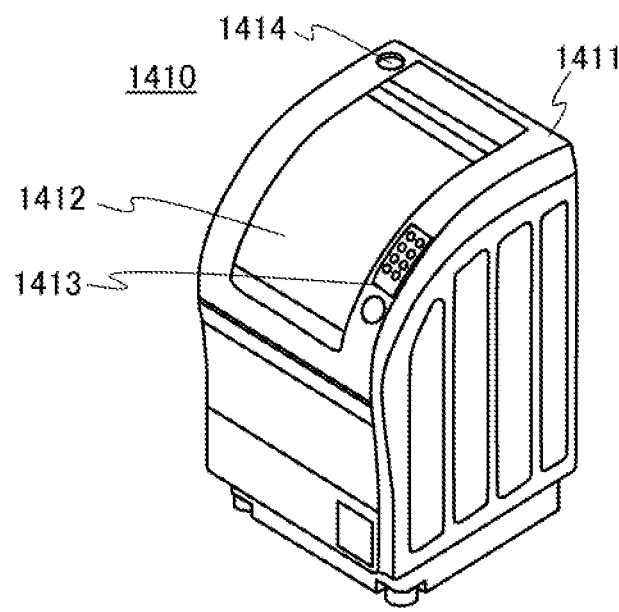

Specifically, the solid-state relay according to one embodiment of the present invention can be used for display devices, personal computers, or image reproducing devices provided with recording media (typically, devices which reproduce the content of recording media such as digital versatile discs (DVDs) and have displays for displaying the reproduced images). Further, as an electronic device which can include the solid-state relay according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, high-frequency heating apparatuses such as microwave ovens, electric rice cookers, electric washing machines, air-conditioning systems such as air conditioners, electric refrigerators, electric freezers, electric refrigerator-freezers, electric sewing machines, electric tools, semiconductor testing devices, and the like can be given. The solid-state relay according to one embodiment of the present invention may be a moving object powered by an electric motor. The moving object is a motor vehicle (a motorcycle or an ordinary motor vehicle with three or more wheels), a motor-assisted bicycle including an electric bicycle, an airplane, a vessel, a rail car, or the like. FIGS. 12A and 12B illustrate specific examples of these electronic devices.

FIG. 12A illustrates a microwave oven 1400, which includes a housing 1401, a treatment room 1402 for placing an object, a display portion 1403, an input device (e.g., an operating panel) 1404, and an irradiation portion 1405 supplying an electromagnetic wave generated from a high-frequency wave generator provided in the housing 1401 to the treatment room 1402. The solid-state relay according to one embodiment of the present invention can be used, for example, to control supply of power to the high-frequency wave generator.

FIG. 12B illustrates a washing machine 1410, which includes a housing 1411, a cover 1412 over a washing tub provided in the housing 1411, an input device (e.g., an operating panel) 1413, and a water inlet 1414 of the washing tub. The solid-state relay according to one embodiment of the present invention can be used, for example, to control supply of power to a motor controlling rotation of the washing tub.

This embodiment can be combined with any of the other embodiments as appropriate.

This application is based on Japanese Patent Application serial No. 2012-087025 filed with Japan Patent Office on Apr. 6, 2012, the entire contents of which are hereby incorporated by reference.

What is claimed is:

1. A solid-state relay comprising:
    a first transistor;
    a second transistor;
    a first transmission circuit; and
    a second transmission circuit,
    wherein a gate of the first transistor is connected to one of a source and a drain of the second transistor,
    wherein one of a source and a drain of the first transistor is connected to a first terminal,
    wherein the other of the source and the drain of the first transistor is connected to a second terminal,
    wherein the first transmission circuit is configured to supply a first signal to the other of the source and the drain of the second transistor wirelessly,
    wherein the second transmission circuit is configured to supply a second signal to a gate of the second transistor, and
    wherein the first terminal is connected to the second terminal when the first signal is supplied to the gate of the first transistor through the second transistor, and the first transistor is turned on by the first signal.

2. The solid-state relay according to claim 1, wherein a channel formation region of the first transistor comprises an oxide semiconductor.

3. The solid-state relay according to claim 1, wherein a channel formation region of the second transistor comprises an oxide semiconductor.

4. The solid-state relay according to claim 1, wherein each of the first transmission circuit and the second transmission circuit comprises a photocoupler.

5. The solid-state relay according to claim 1, wherein each of the first transmission circuit and the second transmission circuit comprises at least a light-emitting element and a light-receiving element.

6. A semiconductor device comprising:
the solid-state relay according to claim 1;
a power source; and
a load,
wherein the first terminal is connected to the power source, and the second terminal is connected to the load.

7. A solid-state relay comprising:
a first transistor;
a second transistor;
a first transmission circuit; and
a second transmission circuit,
wherein a gate of the first transistor is connected to one of a source and a drain of the second transistor,
wherein one of a source and a drain of the first transistor is connected to the other of the source and the drain of the second transistor and a first terminal,
wherein the other of the source and the drain of the first transistor is connected to a second terminal,
wherein the first transmission circuit is configured to supply a first signal to the gate of the first transistor wirelessly,
wherein the second transmission circuit is configured to supply a second signal to a gate of the second transistor, and
wherein the first terminal is connected to the second terminal when the first transistor is turned on by the first signal.

8. The solid-state relay according to claim 7, wherein a channel formation region of the first transistor comprises an oxide semiconductor.

9. The solid-state relay according to claim 7, wherein a channel formation region of the second transistor comprises an oxide semiconductor.

10. The solid-state relay according to claim 7, wherein each of the first transmission circuit and the second transmission circuit comprises a photocoupler.

11. The solid-state relay according to claim 7, wherein each of the first transmission circuit and the second transmission circuit comprises at least a light-emitting element and a light-receiving element.

12. A semiconductor device comprising:
the solid-state relay according to claim 7;
a power source; and
a load,
wherein the first terminal is connected to the power source, and the second terminal is connected to the load.

13. A solid-state relay comprising:
a first transistor;
a second transistor;
a third transistor;
a first transmission circuit; and
a second transmission circuit,
wherein a gate of the first transistor is connected to one of a source and a drain of the second transistor and one of a source and a drain of the third transistor,
wherein one of a source and a drain of the first transistor is connected to a first terminal,
wherein the other of the source and the drain of the first transistor is connected to the other of the source and the drain of the second transistor, the other of the source and the drain of the third transistor, and a second terminal,
wherein a gate of the third transistor is connected to the other of the source and the drain of the third transistor,
wherein the first transmission circuit is configured to supply a first signal to the gate of the first transistor,
wherein the second transmission circuit is configured to supply a second signal to a gate of the second transistor, and
wherein the first terminal is connected to the second terminal when the first transistor is turned on by the first signal.

14. The solid-state relay according to claim 13, wherein a channel formation region of the first transistor comprises an oxide semiconductor.

15. The solid-state relay according to claim 13, wherein a channel formation region of the second transistor comprises an oxide semiconductor.

16. The solid-state relay according to claim 13, wherein each of the first transmission circuit and the second transmission circuit comprises a photocoupler.

17. The solid-state relay according to claim 13, wherein each of the first transmission circuit and the second transmission circuit comprises at least a light-emitting element and a light-receiving element.

18. A semiconductor device comprising:
the solid-state relay according to claim 13;
a power source; and
a load,
wherein the first terminal is connected to the power source, and the second terminal is connected to the load.

* * * * *